(12) United States Patent
Jones et al.

(10) Patent No.: US 8,264,846 B2
(45) Date of Patent: Sep. 11, 2012

(54) CERAMIC PACKAGE SUBSTRATE WITH RECESSED DEVICE

(75) Inventors: Christopher C. Jones, Phoenix, AZ (US); David Bach, Shrewsbury, MA (US); Timothe Litt, Southborough, MA (US); Larry Binder, Clinton, MA (US); Kaladhar Radhakrishnan, Gilbert, AZ (US); Cengiz A. Palanduz, Durham, NC (US)

(73) Assignee: Intel Corporation, Santa Clara, CA (US)

( * ) Notice: Subject to any disclaimer, the term of this patent is extended or adjusted under 35 U.S.C. 154(b) by 1272 days.

(21) Appl. No.: 11/611,063

(22) Filed: Dec. 14, 2006

(65) Prior Publication Data

US 2008/0142961 A1 Jun. 19, 2008

(51) Int. Cl.
*H05K 7/00* (2006.01)
(52) U.S. Cl. ............... 361/760; 361/761; 361/792
(58) Field of Classification Search ........ 361/760–761, 361/792
See application file for complete search history.

(56) References Cited

U.S. PATENT DOCUMENTS

| | | | | |
|---|---|---|---|---|
| 5,095,402 | A * | 3/1992 | Hernandez et al. | 361/306.2 |
| 6,150,742 | A * | 11/2000 | Horner et al. | 310/74 |
| 6,272,020 | B1 | 8/2001 | Tosaki et al. | |
| 6,365,966 | B1 * | 4/2002 | Chen et al. | 257/723 |
| 6,555,902 | B2 * | 4/2003 | Lo et al. | 257/686 |
| 6,731,011 | B2 * | 5/2004 | Verma et al. | 257/777 |
| 6,894,385 | B1 | 5/2005 | Jafari et al. | |
| 7,095,108 | B2 | 8/2006 | Palanduz | |
| 2004/0022038 | A1 | 2/2004 | Figueroa et al. | |
| 2004/0184219 | A1 | 9/2004 | Otsuka et al. | |
| 2005/0112842 | A1 | 5/2005 | Kang et al. | |
| 2005/0285243 | A1 | 12/2005 | Stone et al. | |
| 2006/0000542 | A1 | 1/2006 | Min et al. | |
| 2006/0000641 | A1 | 1/2006 | Salaman et al. | |
| 2006/0067030 | A1 * | 3/2006 | Radhakrishnan et al. | 361/306.1 |
| 2006/0143886 | A1 | 7/2006 | Srinivasan et al. | |
| 2006/0186937 | A1 | 8/2006 | Nai | |
| 2006/0274479 | A1 | 12/2006 | Radhakrishnan et al. | |

FOREIGN PATENT DOCUMENTS

| | | |
|---|---|---|
| EP | 0 582 315 A1 | 2/1994 |
| JP | 06-163809 | 6/1994 |
| JP | 06-302709 | 10/1994 |
| JP | 11-317490 A | 11/1999 |
| JP | 2002-043500 A | 2/2002 |
| JP | 2003-086731 | 3/2003 |
| JP | 2004-241583 | 8/2004 |

(Continued)

OTHER PUBLICATIONS

Scott Vetter et al., "IBM System p5 Quad-Core Module Based on POWER5+ Technology: Technical Overview and Introduction", Redbooks Paper, Copyright IBM Corp., 2006, pp. 1-10.

(Continued)

*Primary Examiner* — Peter Poltorak
*Assistant Examiner* — Abiy Getachew
(74) *Attorney, Agent, or Firm* — Blakely, Sokoloff, Taylor & Zafman LLP (57) ABSTRACT

A ceramic package substrate has a recess. This allows a device in that recess to be close to a die attached to the substrate's top side, for better performance. The device may be an array capacitor, an in-silicon voltage regulator, or another device or devices.

18 Claims, 5 Drawing Sheets

FOREIGN PATENT DOCUMENTS

| | | |
|---|---|---|
| JP | 2004-304159 A | 10/2004 |
| WO | WO 03/023851 A1 | 3/2003 |
| WO | WO 2004/012266 A1 | 2/2004 |
| WO | PCT/US2007/086668 | 12/2007 |

OTHER PUBLICATIONS

Peter Hazucha et al., "Integrated Inductor", U.S. Appl. No. 11/479,626, filed Jun. 29, 2006.

Taiwan Patent Application No. 096143690 Office Action Primary Examination dated Jul. 29, 2011 corresponding to U.S. Appl. No. 11/611,063.

Taiwan Patent Application No. 096143690, corresponding to U.S. Appl. No. 11/611,603, Written Preliminary Examination Decision of Rejections and English translation (11 pgs.).

First Office Action dated Feb. 17, 2012 for China Patent Application No. 200780046341.0 corresponding to U.S. Appl. No. 11/611,063.

Notice of Primary Examination dated Mar. 8, 2012 for Korean Patent Application No. 10-2009-7012366 corresponding to U.S. Appl. No. 11/611,063.

Summary of Notice of Reasons for Rejection dated Oct. 4, 2011 for Japanese Patent Application No. 2009-541489 corresponding to U.S. Appl. No. 11/611,063.

* cited by examiner

CERAMIC PACKAGE SUBSTRATE WITH RECESSED DEVICE

BACKGROUND

Background of the Invention

Capacitors and other devices are used with package substrates to improve decoupling capacitance, impedance droop, and other performance parameters.

DETAILED DESCRIPTION

In various embodiments, an apparatus and method relating to a ceramic package substrate with a recess in its underside and a device in that recess are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order, in series or in parallel, than the described embodiment. Various additional operations may be performed and/or described operations may be omitted in additional embodiments.

Figure 1:
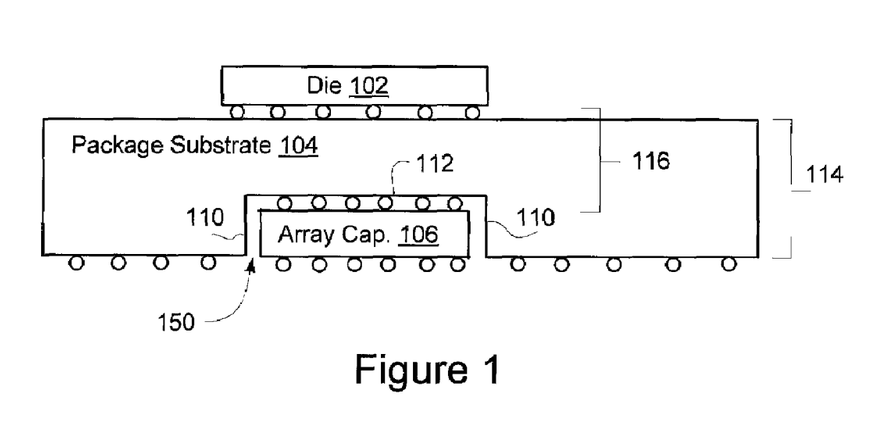
FIG. 1 is a cross sectional side view that illustrates a die package according to one embodiment of the present invention.

FIG. 1 is a cross sectional side view that illustrates a die package 100 according to one embodiment of the present invention. The die package 100 includes a die 102. The die 102 may be a microprocessor die or another type of integrated circuit die. The die 102 is connected to a ceramic package substrate 104. Any type of conductive connectors may be used to connect the die 102 to the ceramic package substrate 104, including solder balls, a land grid array, metal-to-metal bonding, or others. The ceramic package substrate 104 includes multiple layers of a ceramic matrix material in which are disposed conductive vias and traces. These vias and traces provide electronic communication between the die 102 and other components that may be connected to the package substrate 104.

The package substrate 104 has a recess 150, also referred to as cavity 150, in its bottom surface. The recess 150 is defined by recess side walls 110 extending up from the bottom surface of the substrate 104 and a recessed surface 112, the recessed surface 112 being the top surface 112 of the recess 150. The recess 150 may have any desired depth and volume.

There is an electrical device 106 in the recess 150. In the illustrated embodiment, the device 106 is an array capacitor, but in other embodiments, the device 106 may be a standard capacitor, an in-silicon voltage regulator, another type of integrated voltage regulator, or another device or devices.

The device 106 is electrically connected to the ceramic package substrate 104. The electrical connections may be made by any suitable method. The device 106 has conductors (land pads or any other suitable conductors) on its top surface. There may be land pads or other connection points in the top surface 112 of the recess 150. The device 106 may be connected to the top surface 112 of the recess 150 by solder bumps or any other method. In an embodiment, these connections are surface mount—solder balls connect the device 106 to lands on the top surface 112 of the recess 150.

The traces and vias of the package substrate 104 electrically connect the device 106 to the die 102. Because the device 106 is in the recess 150, the distance electrical signals have to travel between the device 106 and the die 102 may be shortened compared to other placements of the device 106. This shortened distance may provide better performance than if the device 106 were positioned further away from the die 102. For example, the ceramic package substrate 104 has a thickness 114. The distance 116 between the device 106 and the die 102 is less than the thickness 114 of the substrate 104 in the illustrated embodiment. If the device 106 were on the bottom side of a substrate 104 that lacked the recess 150, or located off the substrate 104 (as when the device 106 is located on a motherboard), the electrical distance between the device 106 and die 102 would be longer, possibly reducing the performance of the die package 100.

In the illustrated embodiment, the recess 150 and device 106 in the recess 150 are substantially directly beneath the die 102. The centers of the recess 150 and device 106 are substantially directly beneath the center of the die 102. This may help reduce the electrical length of the path that electrical signals travel between the device 106 and die 102. In other embodiments, the recess 150 and device 106 may be directly beneath the die 102, but not on-center. In yet other embodiments, the recess 150 and device 106 may not be directly beneath the die 102; other considerations than shortening the electrical path distance may lead to these other placements.

Figure 2:
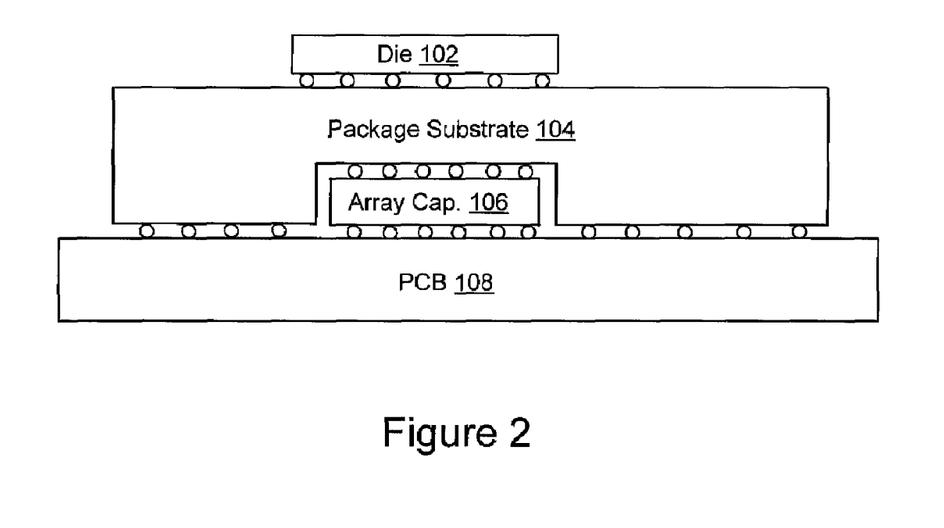
FIG. 2 is a cross sectional side view that illustrates the die package when the package substrate is mounted to a printed circuit board.

FIG. 2 is a cross sectional side view that illustrates the die package 100 when the package substrate 104 is mounted to a printed circuit board (PCB) 108, according to one embodiment of the present invention. The PCB 108 is, for example, a motherboard in a computer system in an embodiment, although it is not limited to such. The package substrate 104 is connected to the motherboard by any suitable method, such as a land grid array, solder balls, or other electrical conductors. The die 102 is thus electrically connected to the PCB 108 by the package substrate 104.

In the illustrated embodiment, the device 106 is directly connected to the PCB 108 by connectors on the bottom side of the device 106. These connectors may be any suitable type of connectors, such as a land grid array, solder balls, or other electrical conductors. The device 106 may include through vias that extend from the bottom surface of the device 106 to allow electrical connection from the capacitor, voltage regulator or other electrical devices at or near the top surface of device 106 to the bottom surface of the device 106.

In other embodiments, there may be no connectors at the bottom surface of device 106. Rather, the device 106 may only be connected to the package substrate 104. Any electrical connections to the die 102 and/or PCB 108 are made through the package substrate 104 in these embodiments.

Use of an array capacitor 106 or other device(s) 106 in the recess 150 can save space compared to devices spread across the top or bottom surfaces of the substrate 104 or located in other places, such as on the PCB 108. Conventional devices on the bottom surface of the substrate 104 would take up space and make that space no longer available for use by connections between the package substrate 104 and the PCB 108. The PCB 108 itself has limited space as well.

Figure 3:
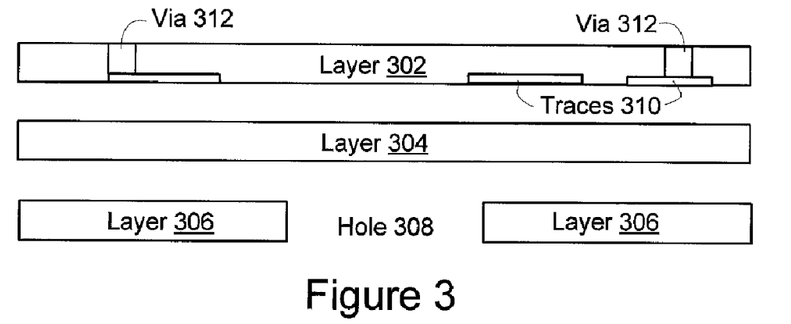
FIG. 3 is a cross-sectional side view that illustrates multiple layers that form the substrate in greater detail.

FIG. 3 is a cross-sectional side view that illustrates multiple layers that form the substrate 104 in greater detail, according to one embodiment of the present invention. The package substrate 104 is formed from multiple layers. Three layers 302, 304, and 306 are illustrated in FIG. 3, although more or fewer layers may be used in other embodiments. Each layer 302, 304, 306 comprises a ceramic matrix material such as alumina. Each layer 302, 304, 306 may be substantially free from an organic or polymer material. As seen in layer 302, layers include conductive traces 310 and vias 312 to allow the package substrate 104 to pass electrical signals between the die 102, the PCB 108, and the device 106 in the recess 150. Any suitable method may be used to pattern the ceramic layers 302, 304, 306 and form the conductive traces 310 and vias 312. For example, holes and depressions may be punched in green ceramic sheets to form the layers 302, 304, 306. Holes and depressions for the traces 310 and vias 312 may then be filled with a conductive material.

Figure 4:
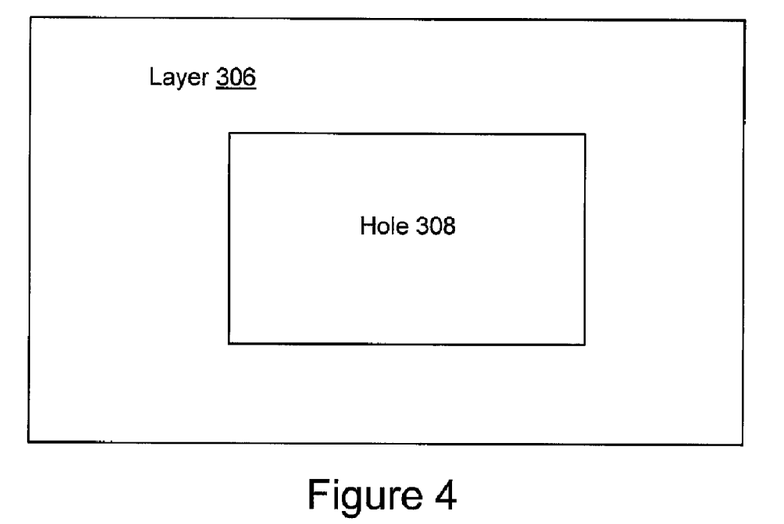
FIG. 4 is a top view that shows layer and the hole.

Layer 306 includes a hole 308. The hole 308 in one or more layers 306 form the recess 150. This hole 308 is created the same way that holes and indentations for the vias 312 and traces 310 are. In another embodiment, holes 308 in layers like layer 306 may be formed in a different way than holes and indentations for the vias 312 and traces 310. FIG. 4 is a top view that shows layer 306 and the hole 308. While the hold 308 is rectangular in the illustrated embodiment, it may have different shapes in other embodiments.

Figure 5:
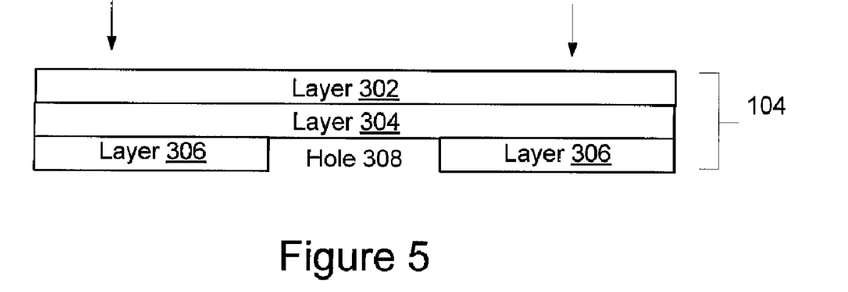
FIG. 5 is a cross-sectional side view that illustrates the layers stacked together to form the substrate.

After the layers 302, 304, 306 are formed, they are stacked and fired to form the substrate 104. FIG. 5 is a cross-sectional side view that illustrates the layers 302, 304, 306 stacked together to form the substrate 104. The stacked 302, 304, 306 layers are fired to harden them and result in the final package substrate 104. Multiple layers 306 with holes 308 may be aligned and stacked, so that the holes 308 together define the recess 150. Other methods to form the substrate 104 and recess 150 may also be used.

Figure 6:
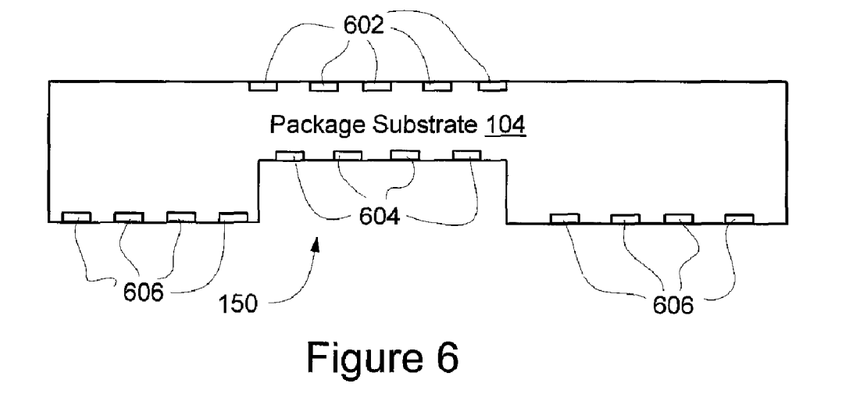
FIG. 6 is a cross-sectional side view that illustrates the finished substrate after the layers have been stacked and fired.

FIG. 6 is a cross-sectional side view that illustrates the finished substrate 104 after the layers 302, 304, 306 have been stacked and fired, according to one embodiment of the present invention. As shown, the finished substrate 104 has contact pads 602 on its top surface to electrically connect the substrate 104 to the die 102, contact pads 604 on the top surface of the recess 150, to electrically connect the substrate 104 to the device 106 in the recess 150, and contact pads 606 on the bottom surface of the substrate 104, to electrically connect the substrate 104 to the PCB 108. In other embodiments, other connections than pads may be used, such as pins or other suitable conductors, and the connections may be placed differently.

Figure 7:
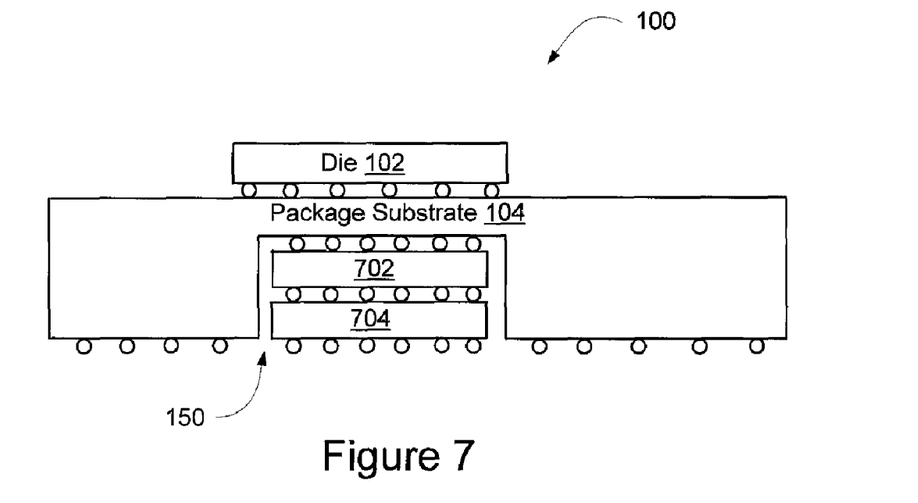
FIG. 7 is a cross-sectional side view that illustrates the die package with two electrical devices within the recess.

FIG. 7 is a cross-sectional side view that illustrates the die package 100 with two electrical devices 702, 704 within the recess 150, rather than just one device 106 as in FIGS. 1 and 2. More than one electrical device 702, 704 may be stacked vertically within the recess 150. For example, the top electrical device 702 is an array capacitor while the bottom electrical device 704 is an in-silicon voltage regulator in the illustrated embodiment. The devices 702, 704 may be different in other embodiments. The top device 702 may have through vias to provide electrical connections on its bottom surface to which the bottom device 704 may be coupled. The bottom device 704 may be electrically connected directly to both the top device 702 and the PCB 108 in some embodiments. In other embodiments, the bottom device 704 may be connected directly only to the top device 702, with electrical communication with the PCB 108 being accomplished through the top device 702 and package substrate 104. Other connection arrangements may also be possible in other embodiments. While the illustrated embodiment shows the devices 702, 704 stacked vertically, they may also be both within the recess 150, but laterally adjacent to each other rather than vertically stacked.

Figure 8:
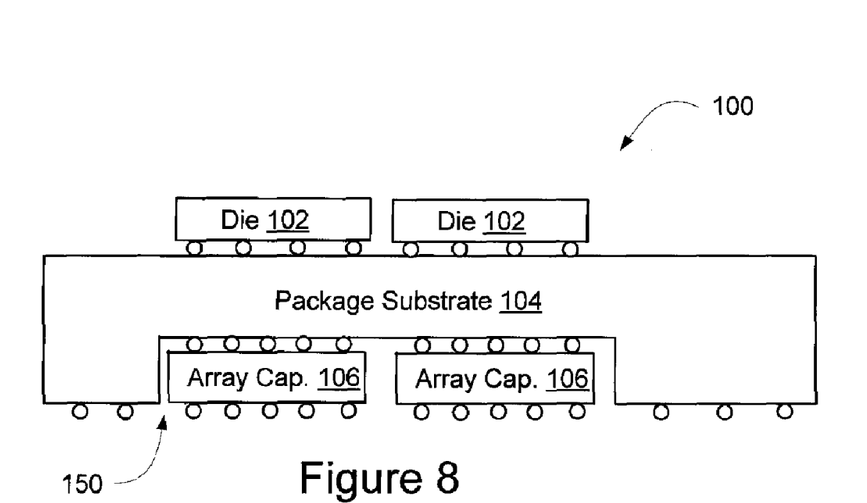
FIG. 8 is a cross-sectional side view that illustrates another embodiment of the die package in which two dies are connected to a package substrate and two electrical devices are within a recess.

FIG. 8 is a cross-sectional side view that illustrates another embodiment of the die package 100 in which two dies 102 are connected to a package substrate 104 and two electrical devices 106, such as two array capacitors 106, are within a recess 150. In such an embodiment, each device 106 may be aligned with a die 102 and provide capacitance for that die 102. While illustrated as within the same recess 150, each device 106 may be within a different recess 150.

Figure 9:
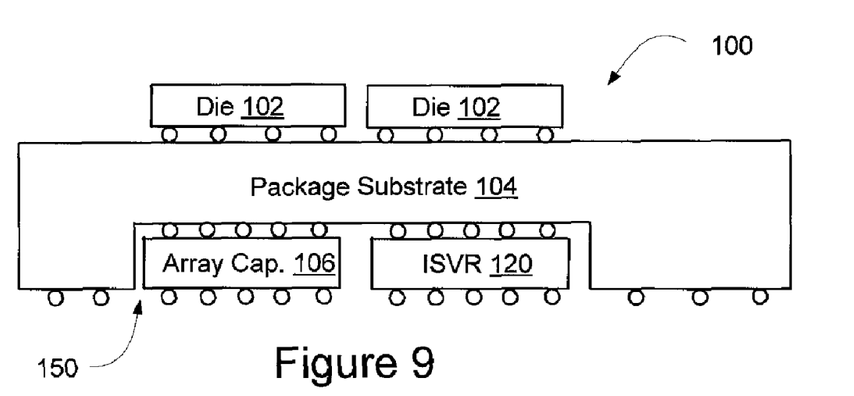
FIG. 9 is a cross-sectional side view that illustrates another embodiment of the die package in which two dies are connected to a package substrate and two devices are within the recess.

FIG. 9 is a cross-sectional side view that illustrates another embodiment of the die package 100 in which two dies 102 are connected to a package substrate 104 and two devices 106, 120 are within the recess 150. In this embodiment, device 106 is an array capacitor and device 120 is an in-silicon voltage regulator. In other embodiments, the devices 106, 120 may be different. Rather than an individual array capacitor 106 for each die 102, a single array capacitor 106 is provided for both dies 102. Similarly, rather than an individual in-silicon voltage regulator 120 for each die 102, a single in-silicon voltage regulator 120 is provided for both dies 102. While illustrated as within the same recess 150, each device 106, 120 may be within a different recess 150. While the illustrated embodiment shows the devices 106, 120 located horizontally adjacent to each other, they may also be both within the recess 150, but vertically stacked on each other.

Figure 10:
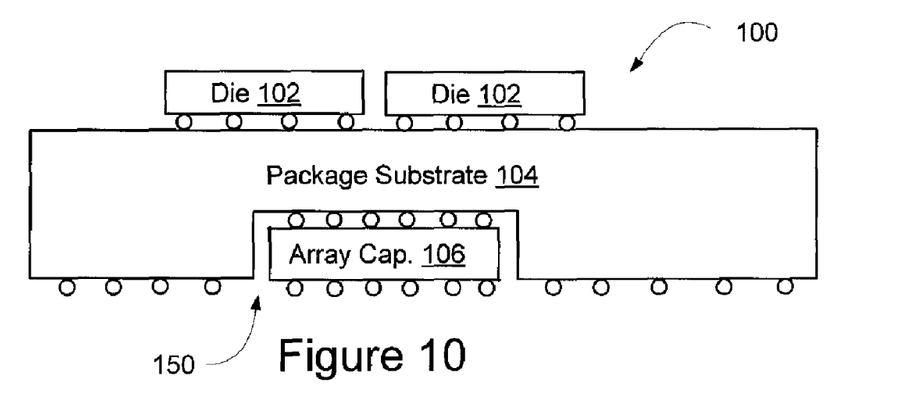
FIG. 10 is a cross-sectional side view that illustrates another embodiment of the die package in which two dies are connected to a package substrate and a single device is within the recess.

FIG. 10 is a cross-sectional side view that illustrates another embodiment of the die package 100 in which two dies 102 are connected to a package substrate 104 and a single device 106 is within the recess 150. In the illustrated embodiment, the device is an array capacitor 106, but it could be a different type of electrical device in other embodiments. Rather than an individual array capacitor 106 for each die 102, a single array capacitor 106 is provided for both dies 102.

Figure 11:
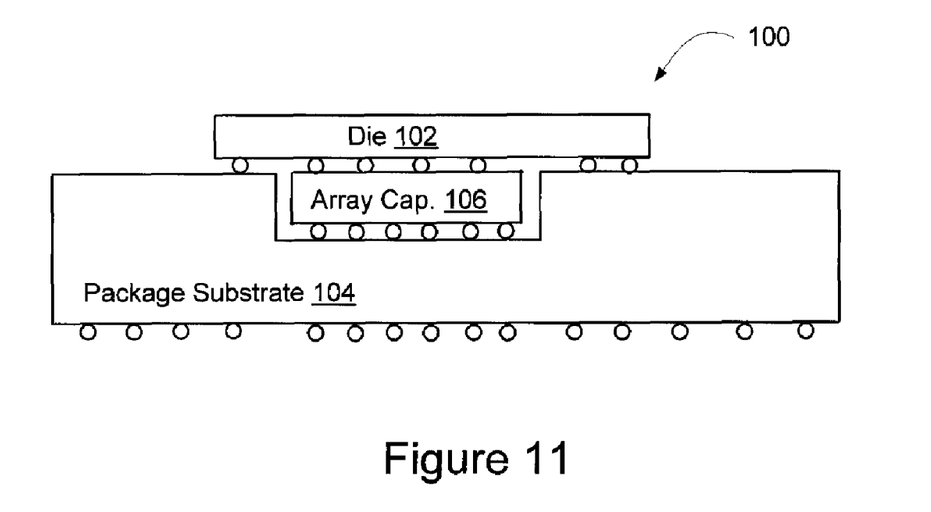
FIG. 11 is a cross-sectional side view that illustrates yet another embodiment of the die package in which the recess and device are in the top of the package substrate rather than the bottom.

FIG. 11 is a cross-sectional side view that illustrates yet another embodiment of the die package 100 in which the recess 105 and device 106 are in the top of the package substrate 104 rather than the bottom. In this embodiment, the device 106 is connected directly to the package substrate 104 and the die 102. The die 102 is directly electrically connected to the package substrate 104 and the device 106. Other connection arrangements may exist in other embodiments. Various arrangements of one or more dies 102, one or more recesses 150, and one or more devices 106 are possible.

As shown in the Figures and as described above, there are many different ways in which electrical devices 106 of different types can be arranged in a recess 150 in a ceramic package substrate 104. There may be multiple devices 106 provided in support of a single die 102, multiple dies 102 supported by a single device 106. The devices 106 may be stacked vertically or located laterally separated from each other. The devices 106 may be in a single recess 150 or multiple recesses 150. The devices 106 may be directly connected to the PCB 108 or die 102, or connected via the package substrate 104. The recess(es) 150 may be in the bottom of the package substrate 104, the top of the package substrate 104, or both the top and the bottom of the package substrate 104.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:
1. A device, comprising:
a first integrated circuit die;
a package substrate, the package substrate including:
a top surface coupled to the first integrated circuit die;
a bottom surface;
multiple matrix layers comprising a ceramic material;
recess side walls extending up from the bottom surface of the package substrate and a recessed surface, the recess side walls and recessed surface defining a cavity in the bottom of the package substrate; and
electrically conductive traces and vias through the matrix layers, to provide an electrically conductive pathway from the top surface to the recessed surface in the cavity; and
a first electrical device in the cavity, the first electrical device chosen from the group consisting of an array capacitor, and an in-silicon voltage regulator, the first electrical device being electrically connected to the first integrated circuit die by at least some of the electrically conductive traces and vias.

2. The device of claim 1, wherein the cavity has a center, the first integrated circuit die has a center, and the center of the cavity is approximately directly under the center of the first integrated circuit die.

3. The device of claim 1, further comprising a printed circuit board adjacent the bottom surface of the package substrate, and electrically connected to the package substrate and to the first electrical device in the cavity.

4. The device of claim 1, wherein the first electrical device in the cavity is an array capacitor.

5. The device of claim 4, further comprising an in-silicon voltage regulator in the cavity.

6. The device of claim 5, wherein the array capacitor is between the in-silicon voltage regulator and the recessed surface.

7. The device of claim 6, wherein the array capacitor is electrically connected to the first integrated circuit die by conductors on a top surface of the array capacitor connected to conductors on the recessed surface, and the array capacitor is electrically connected to the in-silicon voltage regulator by conductors on a bottom surface of the array capacitor and conductors on a top surface of the in-silicon voltage regulator.

8. The device of claim 1, further comprising a second electrical device in the cavity, the second electrical device chosen from the group consisting of an array capacitor, a capacitor, and an in-silicon voltage regulator, the second electrical device being laterally separated from the first electrical device rather than being stacked on top of or below the first electrical device.

9. The device of claim 1, further comprising a second integrated circuit die coupled to the top surface of the package substrate.

10. The device of claim 9, wherein the first and second integrated circuit dies are each a microprocessor die.

11. A semiconductor device, comprising:
a package substrate comprising a ceramic material and conductive traces in the ceramic material, the package substrate having a maximum thickness;
a first integrated circuit die electrically connected to a top surface of the package substrate; and
an array capacitor electrically coupled to the integrated circuit die by the package substrate and being a distance away from the integrated circuit die, the distance being less than the thickness of the package substrate; and wherein the array capacitor is in a recess in a bottom of the package substrate, the recess defined by side walls and a top surface, the thickness between the top surface of the recess and the top surface of the package substrate being less than the maximum thickness of the package substrate.

12. The device of claim 11, further comprising a printed circuit board adjacent the bottom surface of the package substrate, and a first set of conductive connectors to electrically connect the package substrate to the printed circuit board and a second set of conductive connectors to electrically connect the array capacitor to the printed circuit board.

13. The device of claim 12, wherein the printed circuit board is a motherboard in a computer system.

14. The device of claim 13, wherein package substrate and array capacitor are connected to the printed circuit board by a land grid array socket.

15. The device of claim 11, wherein the array capacitor is substantially directly beneath the first integrated circuit die.

16. The device of claim 11, further comprising an in-silicon voltage regulator in the recess adjacent the array capacitor.

17. The device of claim 11, further comprising a second integrated circuit die electrically connected to the top surface of the package substrate, wherein both the first and second integrated circuit dies are microprocessor dies.

18. The device of claim 11, further comprising an in-silicon voltage regulator in said recess wherein said in-silicon voltage regulator is electrically connected to said array capacitor by conductors on a bottom surface of said array capacitor and conductors on a top surface of said in-silicon voltage regulator.

* * * * *